US006325641B1

(12) United States Patent
Nishiyama et al.

(10) Patent No.: US 6,325,641 B1
(45) Date of Patent: Dec. 4, 2001

(54) ELECTRIC JUNCTION BOX

(75) Inventors: Naomasa Nishiyama; Hirofumi Hagikura, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/490,875

(22) Filed: Jan. 24, 2000

(30) Foreign Application Priority Data

Feb. 2, 1999 (JP) ............................................... 11-025187

(51) Int. Cl.[7] .............................. H01R 12/00; H05K 1/00
(52) U.S. Cl. ........................................... 439/76.2; 439/949
(58) Field of Search ................................ 439/76.1, 76.2, 439/621, 949; 174/52.1, 138 F

(56) References Cited

U.S. PATENT DOCUMENTS 2,935,720 * 5/1960 Lorimer ................................ 339/94
5,000,693 * 3/1991 Hatagishi et al. .................. 439/428
5,285,011 * 2/1994 Shimochi ........................... 174/52.1
5,383,800 * 1/1995 Saka et al. .......................... 439/787
5,554,055 * 9/1996 Miller ................................. 439/752
5,645,459 * 7/1997 Fitting ................................ 439/857
5,656,612 * 8/1997 Peterson et al. .................... 439/745

* cited by examiner

*Primary Examiner*—Brian Sircus
*Assistant Examiner*—Hae Moon Hyeon
(74) *Attorney, Agent, or Firm*—Morgan, Lewis & Bockius LLP

(57) ABSTRACT

An electric junction box according to the present invention comprises a notched portion 30 formed in a part of a cover 8 where an electronic unit is connected and a housing 31 separately provided from the cover 8 that is adapted to fit in the notched portion 30. A terminal receiving chamber 9 is provided in this housing in such a manner as to be made to open to a side facing the bus bar 3 so as to hold a relay female terminal 7 in the housing, and a press hold mechanism 35 is provided on sides of the relay female terminal 7 that is received in the terminal receiving chamber 9 in such a manner as to be held by pressing against internal walls of the terminal receiving chamber 9. This press hold mechanism 35 comprises a first projection 36 provided on one of sides of a first female terminal portion 18 adapted to be connected to a first male terminal 4 and a second projection 37 provided on a second female terminal portion 19 on the other side which is a side opposite to the side where the first projection 36 is provided.

3 Claims, 9 Drawing Sheets

ELECTRIC JUNCTION BOX

BACKGROUND OF INVENTION

1. Field of the Invention

The present invention relates to an electric junction box for use for distribution of an electric system of an automobile or the like therein, and more particularly to an electric junction box in which a group of male terminals provided on a bus bar in such a manner as to erect therefrom and a group of male terminals provided on an associated electronic unit in such a manner as to erect therefrom are connected to each other via a group of relay female terminals.

2. Related Art

Conventionally, various types of junction boxes have been in use for distribution of an electric system of an automobile or the like therein. For instance, referring to FIGS. 7 to 9, a conventional assembling construction will be described in which a relay terminal is assembled to a conventional electric junction box. As shown in FIGS. 7 and 8, in a conventional electric junction box 51, a first group of male terminals 4 provided on a bus bar 3 on a laminated electric distribution substrate 2 in such a manner as to erect therefrom and a second group of male terminals 6 provided on an associated electronic unit 5 such as a relay unit in such a manner as to erect therefrom are connected to each other via a group of relay female terminals 57.

To be more specific, terminal receiving chambers 59 made to open toward a bus bar 3 are provided in a cover 58 covering an electric distribution substrate 2 for holding relay female terminals 57. In addition, an insertion through hole 60 having inclined guide surfaces for the second male terminal is formed in a ceiling portion of the terminal receiving chamber 59, and a fit holding groove 62 is formed in a portion above the ceiling portion for holding an electronic unit 5 fitted therein at external walls of the electronic unit.

FIG. 9(*a*) is a side view of the relay female terminal 57, and FIG. 9(*b*) is a plan view thereof. This relay female terminal 57 is formed by folding a metal plate having high electrical conductivity and corrosion resistance such as a brass plate. Sides of a bottom plate 63 are bent to form side plates 64, 65 and one of the side plates, which is the side plate 65, is further bent to form a ceiling plate 66, thus the relay female terminal 57 being formed into a box-like configuration as a whole.

In addition, the side plate 64 is also partially bent over the ceiling plate 66 so as to form a positioning projection plate 67 which is adapted to be brought into engagement with a positioning groove 59*a* provided in the terminal receiving chamber 59. Moreover, a boundary groove 70 is formed in the ceiling plate 66 between a first female terminal portion 68 adapted to be inserted over a first male terminal 4 and a second female terminal portion 69 adapted to be inserted over a second male terminal 6. Furthermore, the ceiling plate 66 is inwardly bent at ends thereof to form first and second elastic contact pieces 71, 72 which are adapted to be brought into contact with the first and second male terminals 4, 6, respectively.

In the electric junction box 51 constructed as described above, a cover 58 is placed in position after the first female terminal portions 68 of the respective relay female terminals 57 are securely inserted over the first group of male terminals 4 provided on the electric distribution substrate 2 in such a manner as to erect therefrom. When this is performed, the cover has to be so placed while the group of relay female terminals 57 provided erectly on the electric distribution substrate 2 are being aligned with the terminal receiving chambers 59 and positioning grooves 59*a* provided in the cover 58. Then, when the electronic unit 5 is securely mounted in the fit holding groove 62, the second male terminals 6 are brought into contact with the second elastic contact piece 72 within the second female terminal portion 69, whereby the bus bar 3 and the electronic unit 5 are electrically connected to each other.

Furthermore, since there is contemplated a positional tolerance of the first group of male terminals 4 and second group of male terminals 6 relative to the position of the group of terminal receiving chambers 59, the relay female terminal 57 is constructed so as to be loosely fitted in the terminal receiving chamber 59 to thereby correct a positioning error.

In the above conventional electric junction box 51, however, when the large cover 58 is placed over the electric distribution substrate 2, with a small pitch between the first male terminals 4, there exists a problem that engagement of the group of relay female terminals 57 within the terminal receiving chambers 59 becomes difficult and hence the working efficiency is deteriorated.

SUMMARY OF INVENTION

The present invention was made in view of the aforesaid problem and an object thereof is to provide an electric junction box for facilitating an operation of mounting the cover onto the electric distribution substrate.

The aforesaid problem the present invention is to solve can be solved by an electric junction box in which a first group of male terminals provided on a bus bar in such a manner as to erect therefrom on an electric distributing substrate and a second group of male terminals provided on an associated electronic unit in such a manner as to erect therefrom are connected to each other via a group of relay female terminals, the electric junction box comprising a notched portion formed in a part of a cover where the electronic unit is connected with the electric junction box, a housing provided separately from the cover so as to be fitted in the notched portion, terminal receiving chambers formed in the housing so as to open to a side thereof facing to the bus bar for holding entirely within the terminal receiving chambers. The relay female terminals in the housing, and a press hold mechanism provided on sides of the relay terminal that is to be received in the housing in such a manner as to be held against internal walls of the terminal receiving chamber by pressing thereagainst.

In addition, in the electric junction box, preferably the press hold mechanism comprises a first projection provided on one of sides of a first female terminal portion adapted to be connected to the first group of male terminals and a second projection provided on the other side of the first female terminal portion or a second female terminal portion adapted to be connected to the second male terminals, the other side being a side opposite to the one of sides where the first projection is provided, and wherein a width-wise dimension between the first and second projections is set to allow the first and second projections to fit between the internal walls of the terminal receiving chamber.

Furthermore, in the electric junction box, the second projection is provided either at a position confronting the first projection on the first female terminal portion relative to a longitudinal center axis of the relay terminal or on the second terminal portion at a position on a line passing through a central point of the central axis and the first projection.

According to the electric junction box of the present invention constructed as described above, the electric junction box comprises a notched portion formed in a part of a cover where the electronic unit is connected with the electric junction box, a housing provided separately from the cover so as to be fitted in the notched portion, terminal receiving chambers formed in the housing so as to open to a side thereof facing to the bus bar for holding the relay female terminals in the housing, and a press hold mechanism provided on sides of the relay terminal that is to be received in the housing in such a manner as to be held against internal walls of the terminal receiving chamber by pressing thereagainst.

Thus, the relay female terminals are inserted and held in the terminal receiving chambers in advance by means of the press hold mechanism, and only the housing can be brought into engagement with the first group of male terminals of the bus bar and held so engaged before the cover is placed on the electric distribution substrate. Moreover, since the housing is smaller than the cover and can be visually observed when the relay female terminals are brought into engagement with the first group of male terminals, connection work can be carried out accurately and easily, and moreover, improvement can be achieved in the efficiency in assembling work of the electric junction box and reliability therein.

In addition, since the press hold mechanism comprises a first projection provided on one of sides of a first female terminal portion adapted to be connected to the first group of male terminals and a second projection provided on the other side of the first female terminal portion or a second female terminal portion adapted to be connected to the second male terminals, the other side being a side opposite to the one of sides where the first projection is provided, and wherein a width-wise dimension between the first and second projections is set to allow the first and second projections to fit between the internal walls of the terminal receiving chamber, the relay female terminals are held between the internal walls of the terminal receiving chambers via the first and second projections, and since the first and second projections are constructed so as to be brought into point contact with the internal walls, only a small insertion force is needed to insert the relay female terminal into the terminal receiving chamber, this serving to improve further the working efficiency.

Furthermore, where the second projection is provided either at a position confronting the first projection on the first female terminal portion relative to a longitudinal center axis of the relay terminal or on the second terminal portion at a position on a line passing through a central point of the central axis and the first projection, in a case where the first and second projections are provided at positions on the sides of the first female terminal portion which positions confront each other, since there is no projection provided on the second female terminal portion which is brought into contact with the internal walls of the terminal receiving chamber when the relay female terminal starts to be inserted into the terminal receiving chamber, it can be inserted with substantially no resistance, and the relay female terminal is finally fitted in the terminal receiving chamber when the confronting first and second projections are brought into contact with the internal walls of the terminal receiving chamber in the vicinity of the opening portion of the terminal receiving chamber.

On the other hand, in a case where the second projection is provided on the second female terminal portion at a position on the line passing through the center point of the central axis and the first projection, since only the second projection exists on one of the sides of the second female terminal portion when the relay female terminal portion starts to be inserted into the terminal receiving chamber, the relay female terminal can be inserted with an extremely small insertion force while being slightly inclined, and the relay female terminal is finally fitted in the terminal receiving chamber in a state in which the initial inclined position is corrected when the first projection of the first female terminal portion and the second projection are brought into contact with the internal walls of the terminal receiving chamber, respectively, in the vicinity of the opening portion of the terminal receiving chamber.

Consequently, the efficiency of work of inserting the relay female terminals into the terminal receiving chambers can further be improved, and since they can securely be held in the terminal receiving chambers, the reliability can also further be improved.

DETAILED DESCRIPTION OF PREFERRED EMBODIMENTS

Figure 1:
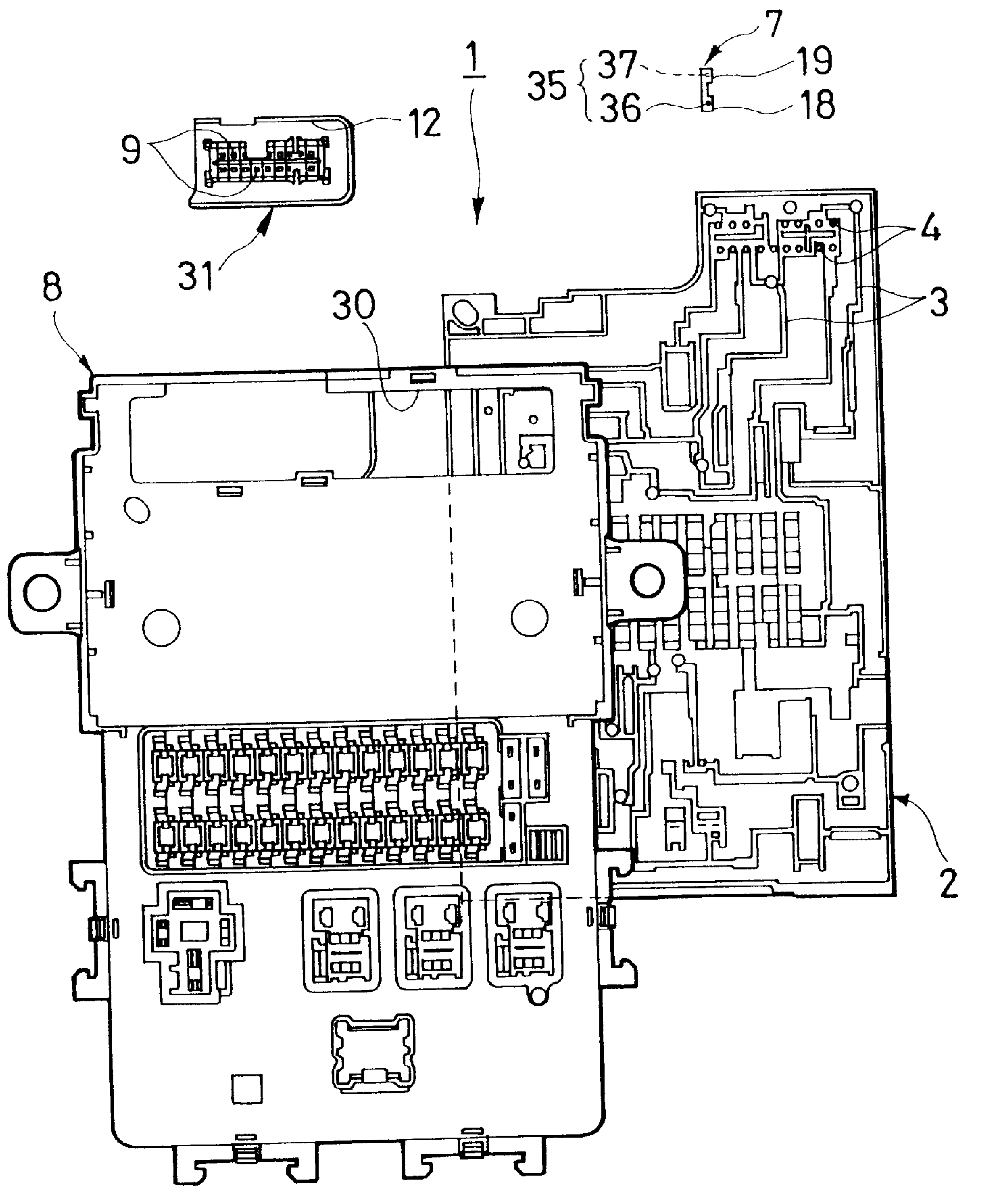
FIG. 1 is an exploded plan view showing a first mode of operation of an electric junction box according to the present invention.

Referring to FIGS. 1 to 6, modes of carrying out an electric junction box according to the present invention will be described in detail below. FIG. 1 is an exploded plan view showing a first mode of carrying out an electric junction box according to the present invention, FIG. 2 an enlarged perspective view of a housing and a relay female terminal shown in FIG. 1, FIGS. 3(*a*) and (*b*) an enlarged view of the relay female terminal shown in FIG. 2, FIGS. 4(*a*) and (*b*) enlarged plan views of the housing showing a relationship between the housing and the relay female terminal shown in FIG. 2, FIG. 5 explanatory views explaining operations in FIG. 2, and FIGS. 6(*a*) and (*b*) an enlarged view showing a relay female terminal according to a second mode of an electric junction box of the present invention.

Figure 8:
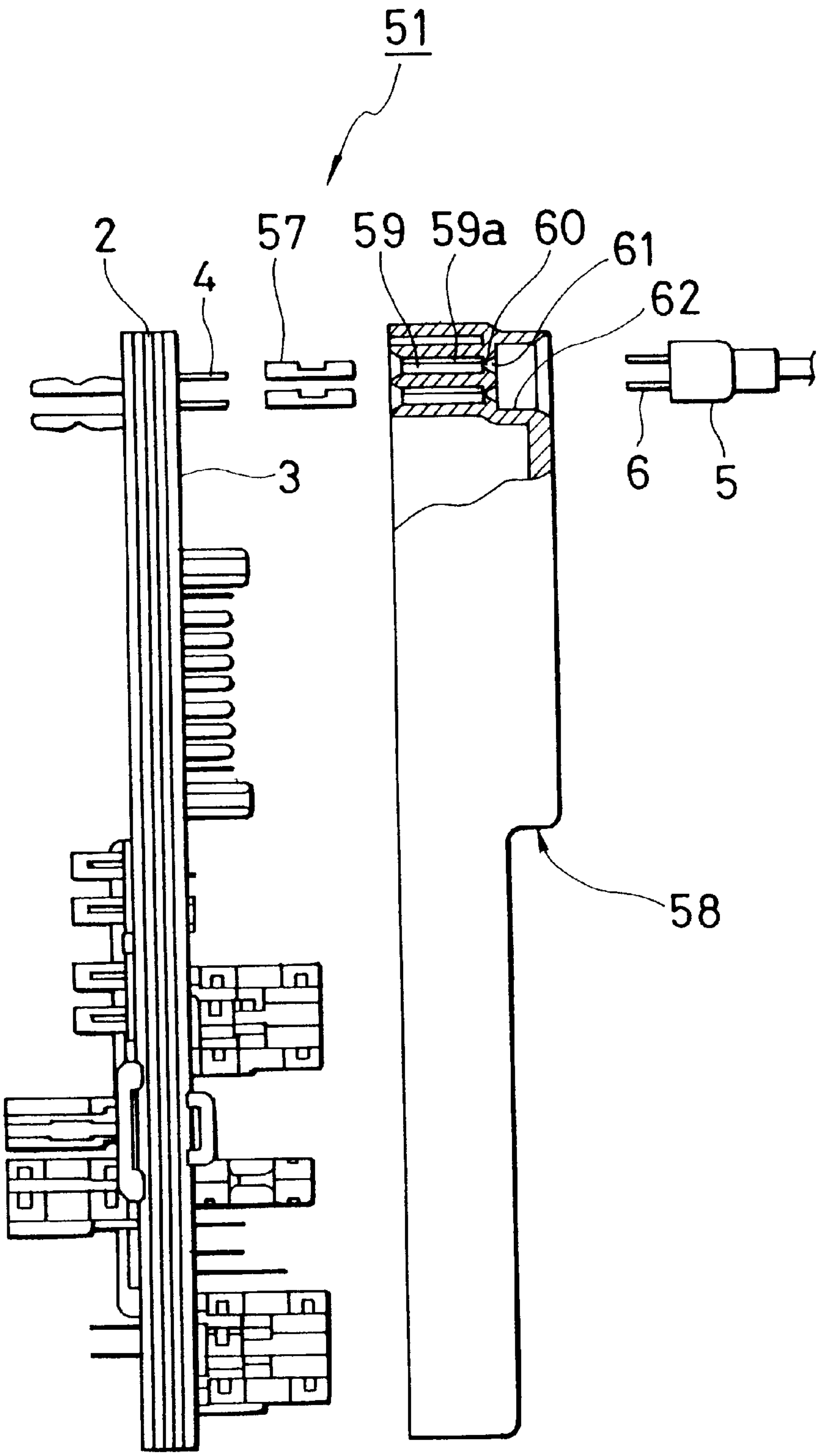
PRIOR ART FIG. 8
FIG. 8 is a sectional view including a terminal receiving chamber shown in FIG. 7.
Figure 9A:
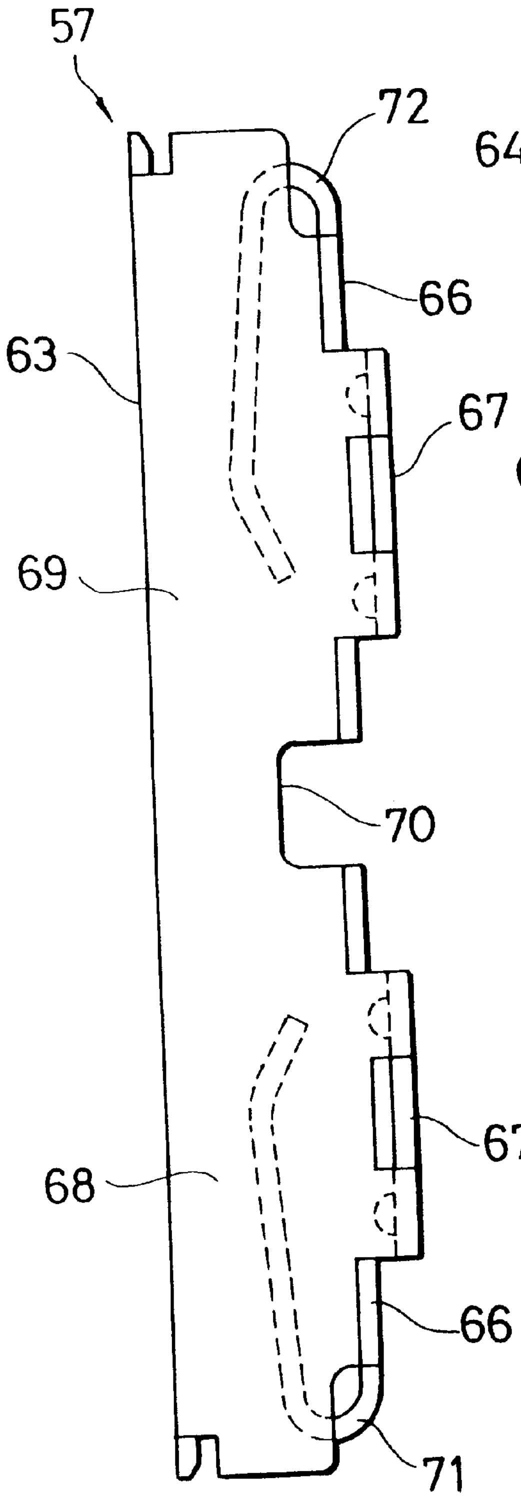
PRIOR ART FIG. 9(a)
FIGS. 9 (*a*) and (*b*) are side and plan views showing a construction of a relay female terminal shown in FIG. 8.
Figure 9B:
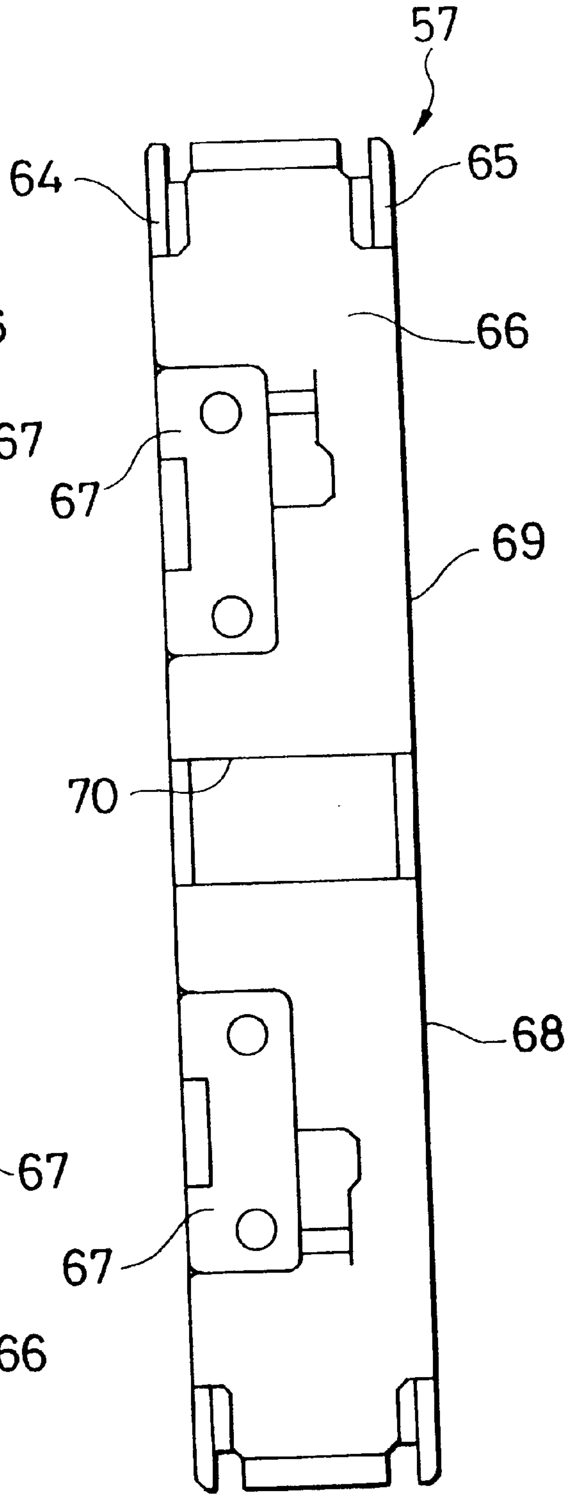
PRIOR ART FIG. 9(b)

As shown in FIGS. 1 to 4, in an electric junction box 1 according to the first mode of the present invention, a first group of male terminals 4 provided erectly on a bus bar 3 on a laminated electric distribution substrate 2 and a second group of male terminals 6 (FIG. 8) provided erectly on an associated electronic unit 5 are connected to each other via group of relay female terminals 7.

Then, in the electric junction box 1 according to the first mode of carrying out the present invention, a notched portion 30 is provided in a cover 8 for covering the electric distribution substrate 2 and to which the electronic unit 5 is connected, and a housing 31 is provided separately from the cover 8 so as to fit in the notched portion 30. In this housing 31, there are provided terminal receiving chambers 9 which are made to open toward a side facing the bus bar 3 for receiving therein relay female terminals 7.

Figure 4A:
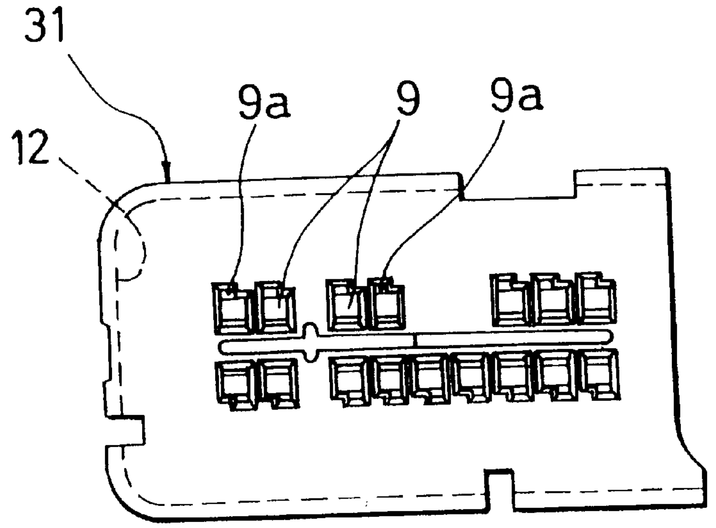
FIGS. 4(*a*) and (*b*) is a partially enlarged view showing the relationship between the housing and the relay female terminal shown in FIG. 2.
Figure 4B:
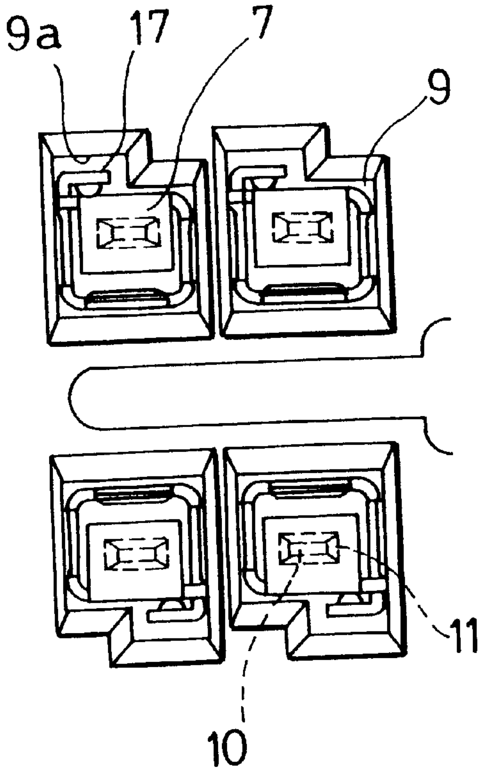

In addition, as shown in FIG. 4(*a*), a fit holding frame 12 is formed on a ceiling portion for holding the electronic unit 5 fitted therein at external walls thereof, and as shown in FIG. 4(*b*), formed in the ceiling portion of the terminal receiving chamber 9 through hole 10 having inclined guide surfaces 11 for the second male terminal 6.

Figure 3A:
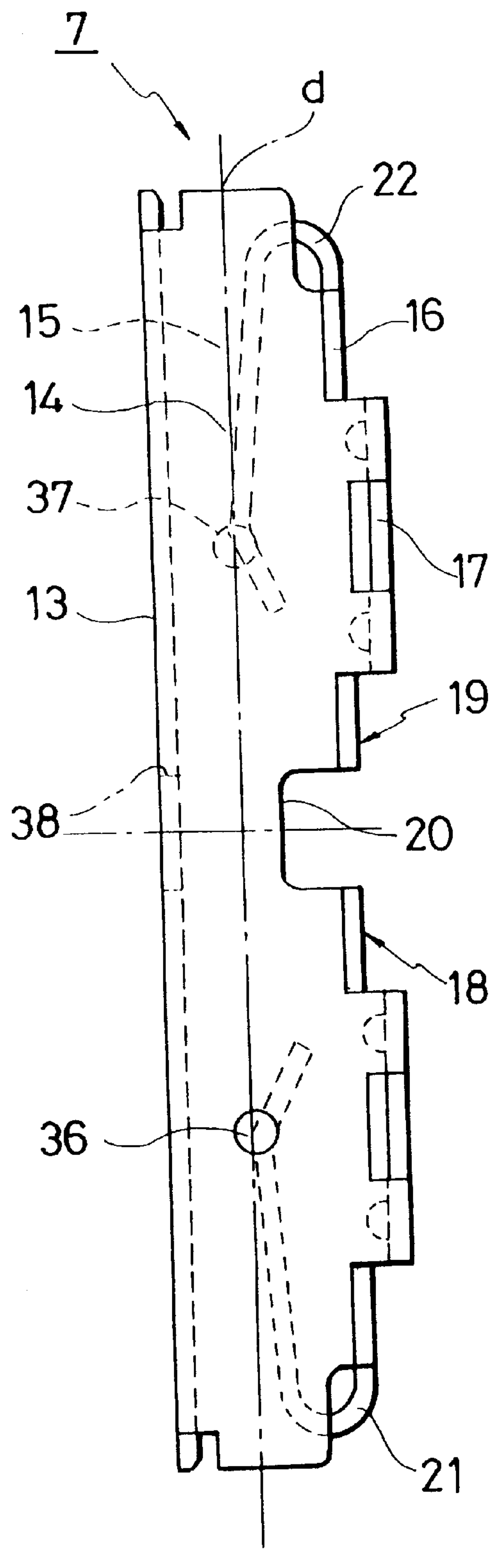
FIGS. 3(*a*) and (*b*) are side and plan views showing the construction of the relay female terminal shown in FIG. 2.
Figure 3B:
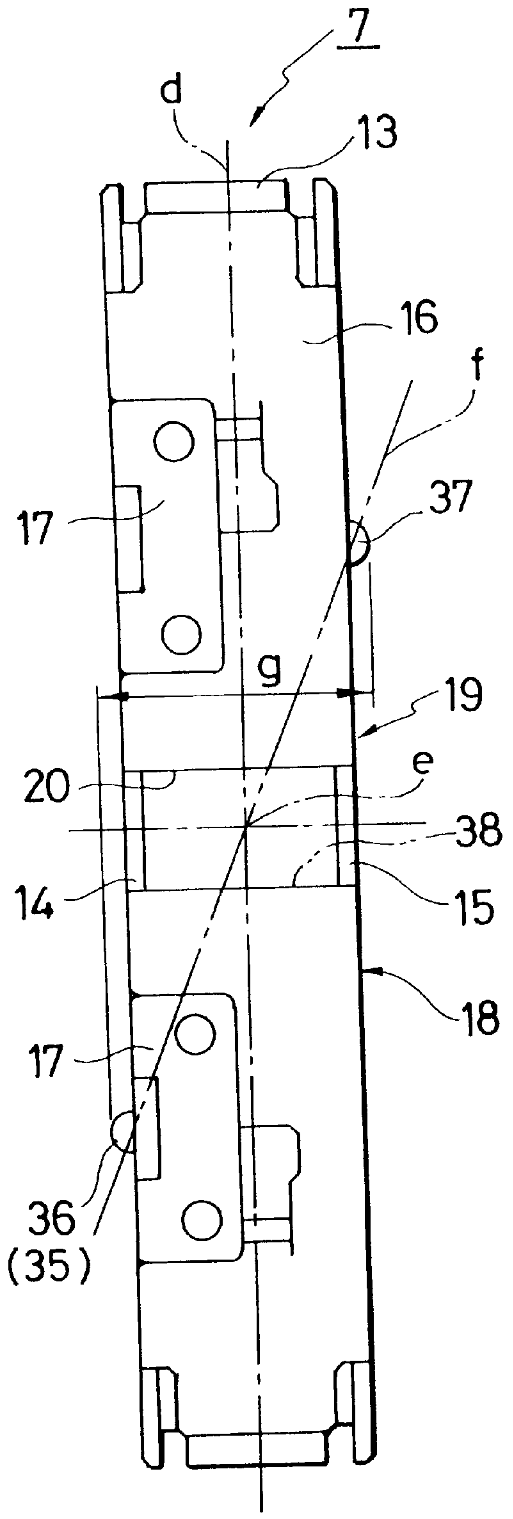

FIG. 3(*a*) is an enlarged side view of the relay female terminal 7, and FIG. 3(*b*) an enlarged plan view of the relay female terminal. The relay female terminal 7 according to the present invention is formed by a metal plate having higher electrical conductivity and corrosion resistance such as a brass plate. Sides of a bottom plate 13 are bent so as to form side plates 14, 15, and one of the side plates, which is the side plate 15, is further bent to form a ceiling plate 16, thus the relay female terminal being formed into a substantially box-like configuration. In addition, the side plate 14 is partially further bent over the ceiling plate 16 so as to form positioning projection plates 17, so that they can engage in positioning grooves 9*a* (refer to FIG. 4) formed in the terminal receiving chamber 9.

In addition, a boundary groove 20 is formed in the ceiling plate 16 between a first female terminal portion 18 adapted to securely be fitted on the male terminal 4 and a second female terminal portion 19 into which the second male terminal 6 (refer to FIG. 8) is inserted. Moreover, ends of the ceiling plate 16 are inwardly bent so as to form first and second elastic rubber contact pieces 21, 22, and when they come into contact with the first and second group of terminals 4,6 to thereby establish an electric connection.

In the relay female terminal 7 according to the first mode of operation of the invention, a press hold mechanism 35 is provided on the side plates 14, 15 of the relay female terminal 17 so as to hold it in the terminal receiving chamber by pressing against the internal walls of the terminal receiving chamber 9. In this press hold mechanism 35, a first semi-spherical projection 36 adapted to abut against the internal walls of the terminal receiving chamber 9 is provided on the side plate 14 of the first female terminal portion 18 adapted to be connected to the first male terminal 4, and similarly a second semi-spherical projection 37 adapted to abut against the internal walls of the terminal receiving chamber 9 as with the first-projection 36 is provided on the side plate 15 of the second female terminal portion 19 adapted to be connected to the second male terminal 6.

To be more specific, the second projection 37 is provided on the side plate 15 of the second female terminal portion 19 at a position on a line f passing through the first projection 36 and a center point e on a longitudinal axis d of the relay female terminal 7. A width-wise dimension g between distal end portions of the first projection 36 and the second projection 37 is set to be slightly larger than a width h between the confronting internal walls of the terminal receiving chamber 9 (FIG. 5(*a*)) such that the projections slightly deflect relative to the internal walls of the terminal receiving chamber 9 so as to be fitted between the internal walls of the same chamber.

Figure 2:
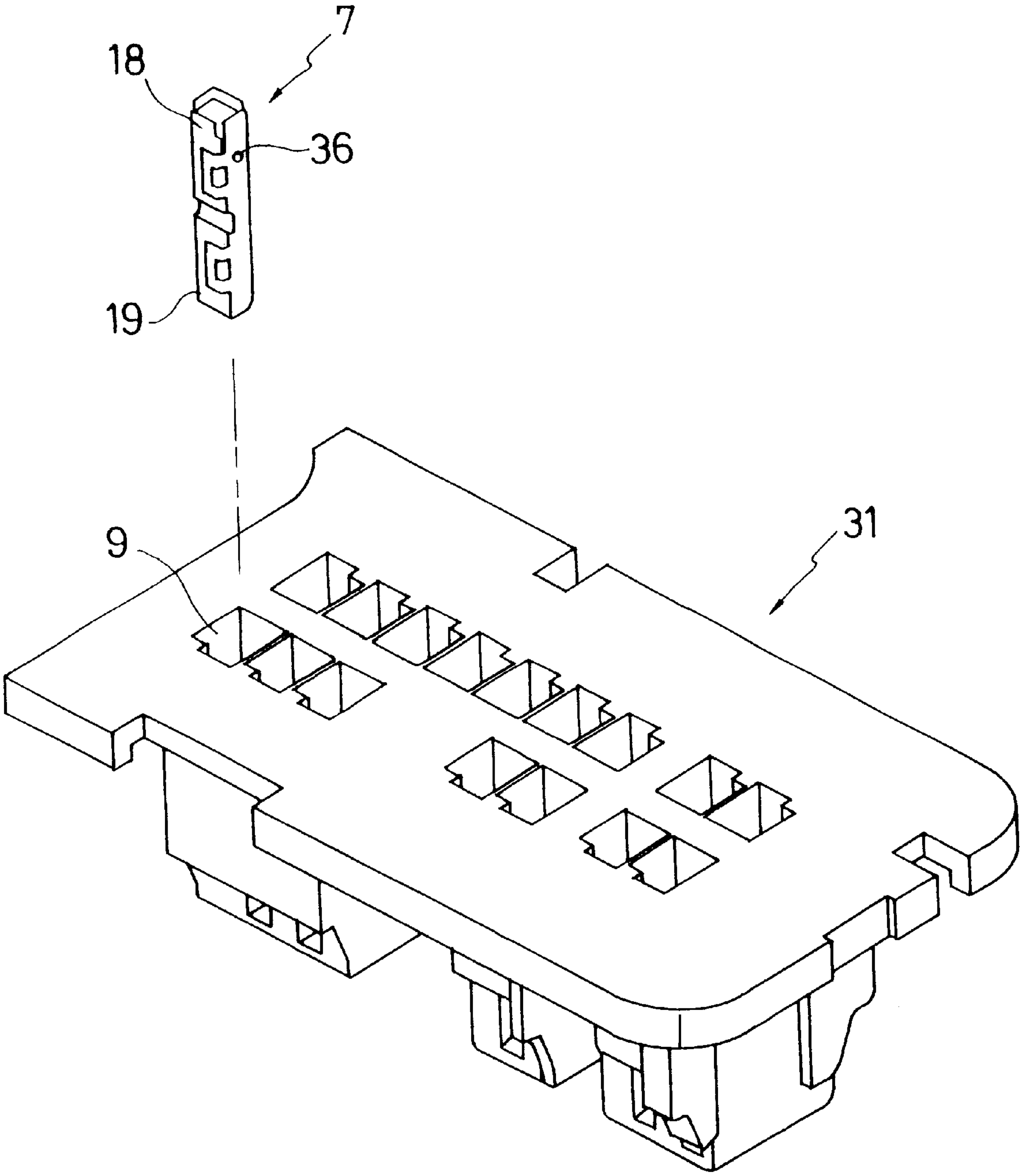
FIG. 2 is a perspective view showing a relationship between a housing and a relay female terminal shown in FIG. 1.

Next, an assembling procedure of the electric junction box 1 constructed as described above will be described. First of all, as shown in FIGS. 2 and 4, the relay female terminal 7 is inserted into an opening portion of the terminal receiving chamber 9 from the back side of the housing 31 provided separately from the cover 8 while the positioning projection plates 17 are being aligned with the positioning groove 9*a*. Then, as shown in FIG. 5(*a*), at the second terminal portion 19, the relay female terminal 7 is inserted while the whole of the relay female terminal 7 is being slightly inclined rightward with the second projection 37 abutting against the right-hand side internal wall of the terminal receiving chamber 9 when viewed in the same figure.

Figure 5C:
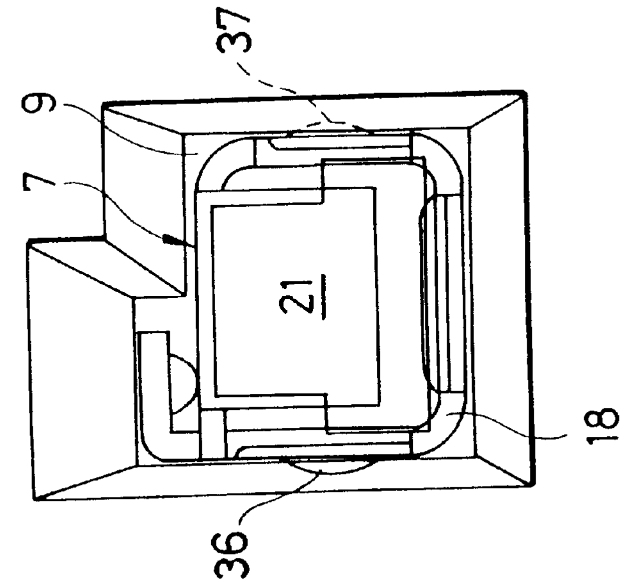
FIGS. 5(*a*), (*b*) and (*c*) is an explanatory view of an operation of the mode shown in FIG. 1.
Figure 5B:
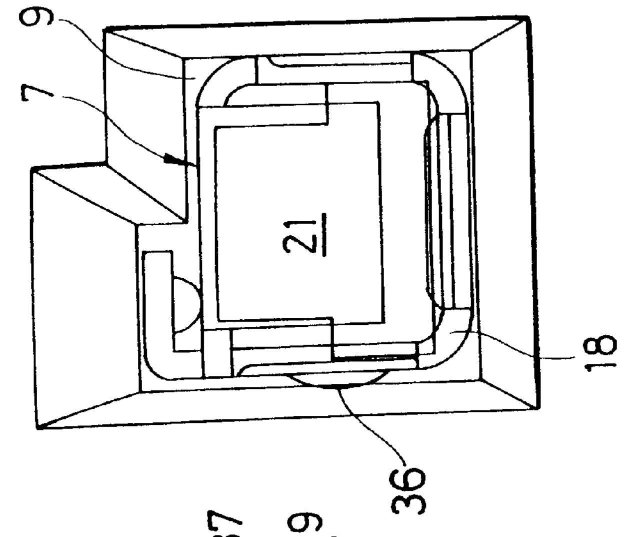
Figure 5A:
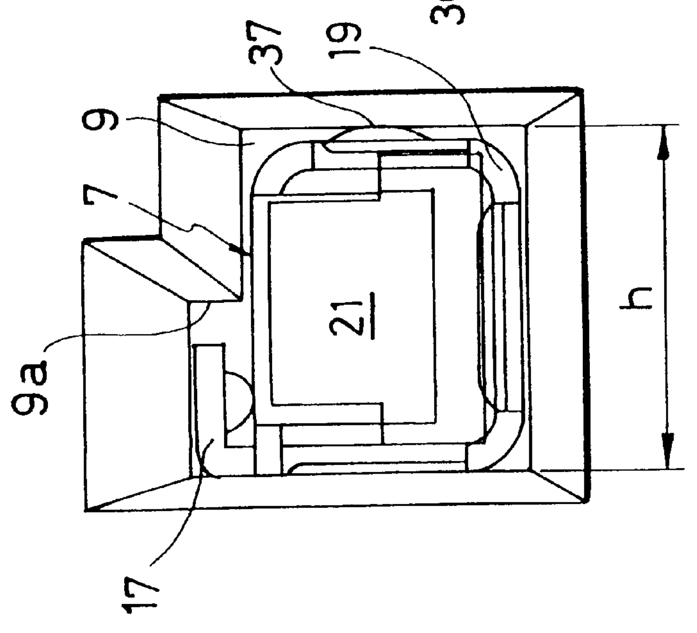

Then, as the insertion further progresses, as shown in FIG. 5(*b*), when the first projection 36 comes to abut against the left-hand side internal wall of the terminal receiving chamber 9 as viewed in the same figure, the posture of the relay female terminal 7 which is inclined slightly rightward is corrected and then the relay female terminal 7 continues to be inserted along the center axis of the terminal receiving chamber 9, thus this inserting operation being kept carried on until an end of the first female terminal portion 18 is completely inserted into the terminal receiving chamber 9. Then, finally the relay female terminal is, as shown in FIG. 5(*c*), held within the terminal receiving chamber 9 in a state in which the first projection 36 and the second projection 37 are in abutment with the confronting internal walls of the terminal receiving chamber 9.

Next, the housing 31 having the group of relay female terminals 7 received therein is, as shown in FIG. 1, brought into engagement with the first group of male terminals 4 provided erectly on the electric distribution substrate 2. Thereafter, the cover 8 is placed on the electric distribution substrate 2 while the notched portion 30 in the cover 8 is being aligned with the housing 31 which has been attached before, and when the cover 8 comes to engagement with an electric junction box main body, not shown, for holding the electric distribution substrate 2, the assembly of the cover 8 is completed.

As is described above, in the electric junction box according to the mode of operation of the present invention, the notched portion 30 is provided in the part of the cover 8 where the electronic unit 5 is connected to the electric junction box 1, and the housing 31 is provided separately from the cover 8 so as to fit in the notched portion 30 so formed. In addition, the terminal receiving chambers 9 are provided in the housing 31 so as to be made to open toward the side facing the bus bar 3 for holding therein the respective relay female terminals 7, and the press hold mechanism 35 is provided on the sides of the respective relay female terminals 7 so as to be held in place when pressing against the internal walls of the respective terminal receiving chambers.

Consequently, the relay female terminal 7 is inserted into the terminal receiving chamber 9 from the back side of the housing 31 in advance by means of the press hold mechanism 35, and the housing 31 is securely inserted on the first group of male terminals 4 of the bus bar 3. Thereafter, the cover 8 is placed such that the housing 31 fits in the notched portion 30. Thus, since the housing 31 is smaller than the cover 8 and can be visually observed when the relay female terminals 7 are securely inserted on the first group of male terminals 4, an accurate connecting operation can be performed, whereby the efficiency of the assembling operation can be improved and hence a highly reliable electric junction box can be obtained.

In addition, as the aforesaid press hold mechanism 35, the first projection 36 and the second projection 37 are provided, the first projection 36 being provided on one of the sides of the first female terminal portion 18 that is to be connected to the first male terminal 4 so as to abut against the internal wall of the terminal receiving chamber 9, the second projection 37 being provided on the other side on the second female terminal portion 19 that is to be connected to the second male terminal 6 so as to abut against the internal wall of the terminal receiving chamber 9, the other side being a side opposite to the one of the sides where the first projection 36 is provided.

Consequently, the relay female terminal 7 is securely held between the internal walls of the terminal receiving chamber 9 by means of the first projection 36 and the second terminal projection 37 provided, respectively, on the different sides of the first terminal portion 18 and the second female terminal portion 19. In addition, since the first projection 36 and second projection 37, and the internal walls of the terminal receiving chamber 9 are in point contact with each other and only the single projection is provided on the different sides of the first female terminal portion 18 and the second female terminal portion 19, only an extremely small insertion force is needed for insertion of the relay female terminal 7 into the terminal receiving chamber 9, whereby the efficiency of the assembling operation can further be improved.

Next, a second mode of carrying out an electric junction box according to the present invention will be described, referring to FIGS. 6(*a* and (*b*). This relay female terminal 41 according to the second mode is different from the relay female terminal 7 according to the first mode in that the second projection 37 is deleted from a second female terminal portion but a second projection 47 is provided on a first female terminal portion 42. In addition, like reference numerals are given to components having like constructions and a detailed description thereof will be omitted.

Figure 6A:
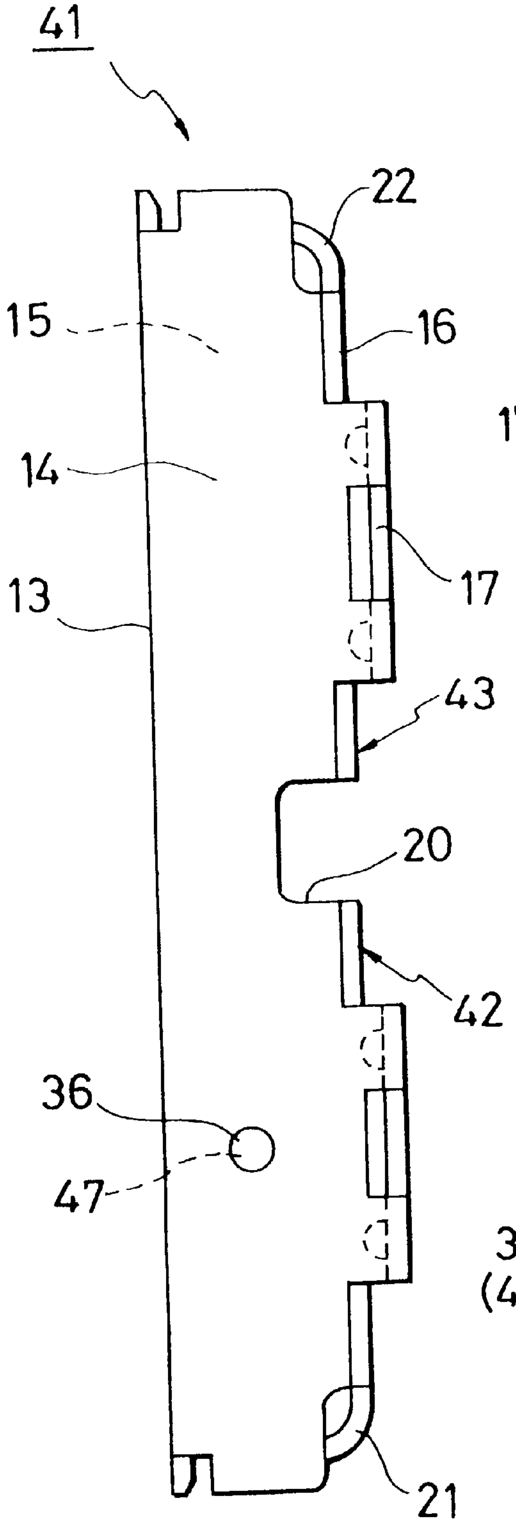
FIGS. 6(*a*) and (*b*) are side and plan views showing a construction of a relay female terminal according to a second mode of operation of an electric junction box of the present invention.
Figure 6B:
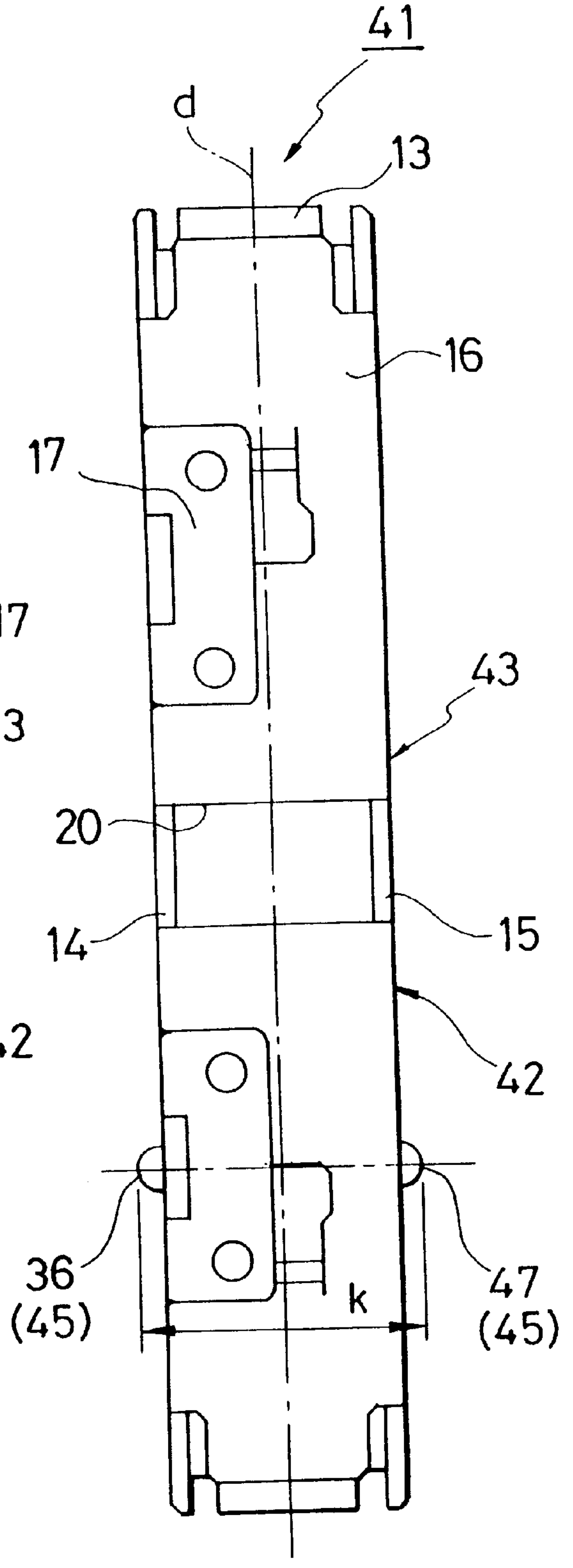
Figure 7:
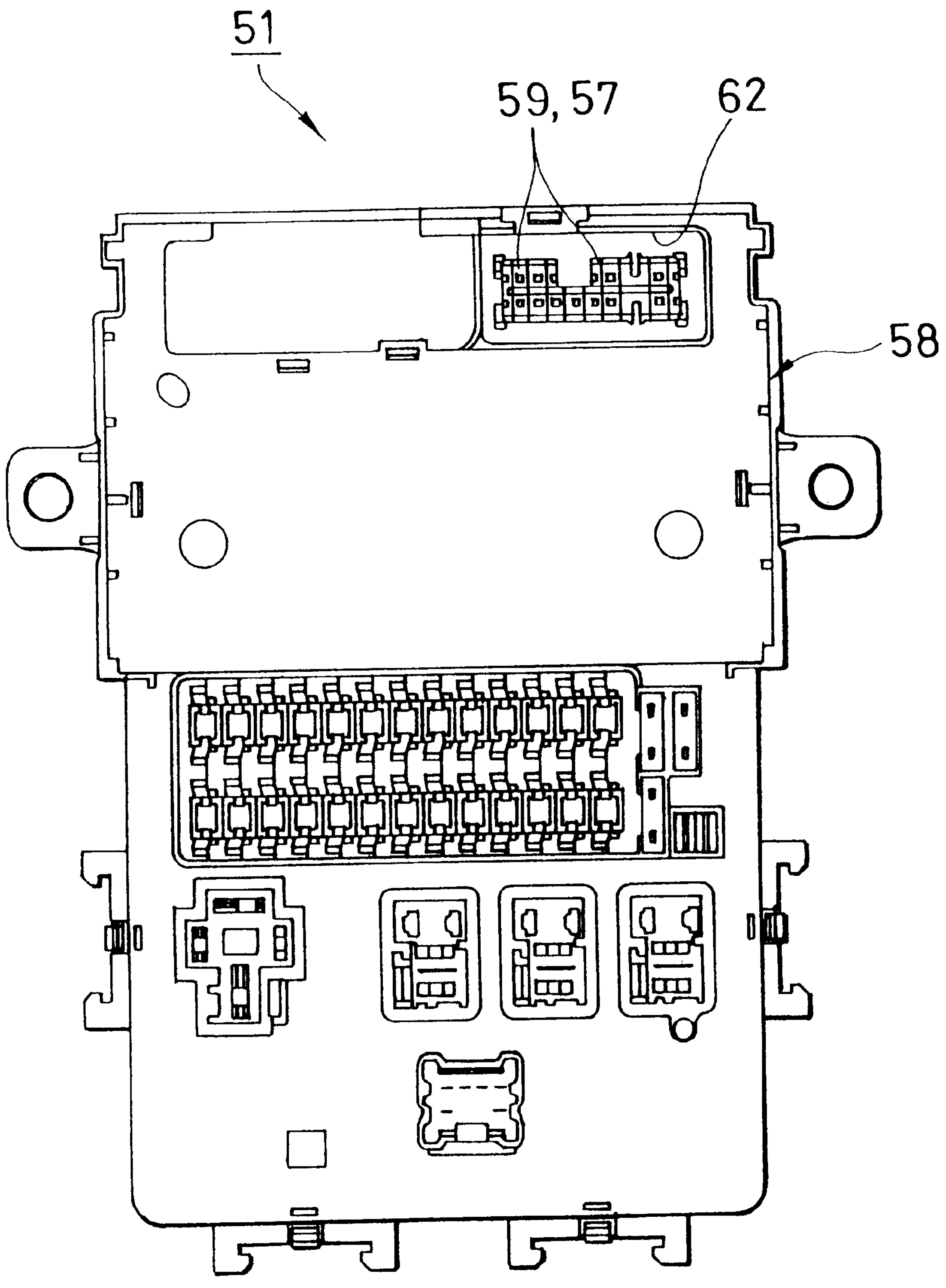
PRIOR ART FIG. 7
FIG. 7 is a plan view showing one example of conventional electric junction boxes.

As shown in FIG. 6, in a press hold mechanism 45 of the relay female terminal 41 of this mode of operation, there is no projection provided on the second female terminal portion 43, but the second projection 47 is provided on the side plate 15 on an opposite side confronting the first projection 36 on the first female portion 42, and a width-wise dimension k between the second projection 47 and the first projection 36 is set to be slightly larger than the distance between the internal walls of the terminal receiving chamber 9 such that the projections can fit between the internal walls of the terminal receiving chamber 9 with a slight deflection of the relay female terminal 41.

Next, an assembling operation of the relay female terminal 41 constructed as described above will be described. The press hold mechanism 45 according to this mode of operation of the electric junction box of the invention has no projection on the side of the second female terminal portion 43 but comprises the first projection 36 provided on the one of the side plates, which is the side plate 14, the second projection 47 provided on the other side plate 15 positioned on the side which is opposite to the first projection 36.

Consequently, when the relay female terminal 41 is inserted into the terminal receiving chamber 9, since there is no projection provided on the side of the second female terminal portion 43, the relay female terminal 41 can be inserted into the terminal receiving chamber 9 with substantially no resistance, and when the relay female terminal 41 comes to the vicinity of the opening of the terminal receiving portion 9 with the first projection 36 and the second projection 47 being in abutment with an end of the opening, with a further push, the relay female terminal 41 can be held in the terminal receiving chamber 9. Moreover, since the relay female terminal 41 comes to contact with the internal walls of the terminal receiving chamber 9 only at the points, there is needed only an extremely small insertion force, this serving to improve further the efficiency of the assembling operation.

It is needless to say that the present invention is not limited to the aforesaid modes of operation of the present inventions but may be suitably modified so as to construct other modes. For instance, either of the press hold mechanisms explained in the modes described above utilizes the semi-spherical projections provided on the side plates, but instead thereof a conical or pyramidal projection may be used. In addition, predetermined positions of the side plates may be cut and raised outwardly so as to form another press hold mechanism.

Furthermore, as shown in FIGS. 3(*a*) and (*b*) provision of a notched window 38 in a portion of the bottom plate 13 corresponding to the boundary groove 20 can impart the flexibility to the side plates 14, 15 at the boundary groove 20, and when this is coupled with the above press hold mechanism, it is possible to expand a range of the first and second female terminal portions 18, 19 that can absorb individual positional errors of the first and second groups of male terminals 4, 6.

As has been described heretofore, the electric junction box according to the present invention comprises the notched portion provided in the part of the cover where the electronic unit is connected to the electric junction box, the housing separately provided from the cover so as to fit in the notched portion, the terminal receiving chamber provided to be made to open toward the side facing the bus bar so as to hold the relay female terminal in the housing and the press hold mechanism provided on the sides of the relay female terminal adapted to be inserted into the terminal receiving chamber in such a manner as to be held by pressing against the internal walls of the terminal receiving chamber.

Consequently, the relay female terminal is inserted and held in advance into the terminal receiving chamber in the housing by means of the press hold mechanism and only the housing may be brought into engagement with the first group of male terminals of the bus bar so as to be held thereat before the cover is placed over the electric distribution substrate. Moreover, since the housing is smaller than the cover and therefore can be visually observed when the relay female terminal is brought into engagement with the fist group of male terminals, the connecting operation can be performed accurately and easily, this serving to improve not only the efficiency of the assembling operation but also the reliability of the electric junction box.

In addition, the press hold mechanism comprises the first projection provided on one of the sides of the first female terminal portion and the second projection provided either on the first female terminal portion or the second female terminal portion that is to be connected to the second male terminal on the side opposite the side where the first projection is provided, and the width-wise dimension between the first and second projections is set such that the projections fit between the internal walls of the terminal receiving chamber. With this construction, the relay female terminal is held between the internal walls of the terminal receiving chamber with the first and second projections. Moreover, since the first and second projections are brought into contact with the internal walls of the terminal receiving chamber at the points, there is needed only an extremely small insertion force for an insertion of the relay female terminal into the terminal receiving chamber, this serving to improve further the efficiency of the assembling operation.

Furthermore, the provision of the second projection at a position opposite to the first projection on the first female terminal portion relative to the longitudinal center axis of the relay female terminal or on the second female terminal portion at a position on the line passing through the center point of the center axis and the first projection can not only improve the efficiency of the operation of inserting the relay female terminal into the terminal receiving chamber but also securely hold the relay female terminal within the terminal receiving chamber, the reliability of the electric junction box being thereby improved further.

What is claimed is:

1. An electric junction box in which a first group of male terminals provided on a bus bar in such a manner as to erect therefrom on an electric distributing substrate and a second group of male terminals provided on an associated electronic unit in such a manner as to erect therefrom are connected to each other via a group of relay female terminals, said electric junction box comprising:

a cover with a notched portion where said electronic unit is connected with said electric junction box;

a housing provided separately from said cover so as to be fitted in said notched portion;

terminal receiving chambers formed in said housing so as to open to a side thereof facing said bus bar for holding entirely within the terminal receiving chambers said relay female terminals; and a press hold mechanism provided on sides of said relay female terminals in such a manner as to be held against internal walls of said terminal receiving chambers by pressing thereagainst.

2. An electric junction box as set forth in claim, wherein said press hold mechanism includes a first projection provided on one of sides of a first female terminal portion adapted to be connected to said first group of male terminals and a second projection provided on the other side of said first female terminal portion or on a second female terminal portion adapted to be connected to said second male terminals, said other side being a side opposite to said one of sides where said first projection is provided, and wherein a width-wise dimension between said first and second projections is set to allow said first and second projections to fit between the internal walls of said terminal receiving chambers.

3. An electric junction box as set forth in claim 2, wherein said second projection is provided at a position confronting said first projection on said first female terminal portion relative to a longitudinal center axis of said relay terminal and on said second terminal portion at a position on a line passing through a central point of said central axis and said first projection.

* * * * *